(12) United States Patent
Kim

(10) Patent No.: US 11,569,100 B2
(45) Date of Patent: Jan. 31, 2023

(54) SUBSTRATE HEATING UNIT AND SUBSTRATE PROCESSING APPARATUS HAVING THE SAME

(71) Applicant: SEMES CO., LTD., Chungcheongnam-do (KR)

(72) Inventor: Hyun-Su Kim, Hwaseong-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 892 days.

(21) Appl. No.: 16/373,208

(22) Filed: Apr. 2, 2019

(65) Prior Publication Data
US 2019/0318946 A1   Oct. 17, 2019

(30) Foreign Application Priority Data

Apr. 16, 2018   (KR) .................. 10-2018-0043803

(51) Int. Cl.
*H01L 21/67*   (2006.01)
*H01L 25/075*   (2006.01)

(52) U.S. Cl.
CPC .. *H01L 21/67115* (2013.01); *H01L 21/67051* (2013.01); *H01L 25/0753* (2013.01)

(58) Field of Classification Search
CPC ................................................ G02B 19/0066
See application file for complete search history.

(56) References Cited

U.S. PATENT DOCUMENTS

| | | | |
|---|---|---|---|
| 2012/0113640 A1* | 5/2012 | Markle | F21V 14/02 362/249.02 |
| 2015/0147911 A1* | 5/2015 | Logan, Jr. | H01R 12/91 29/842 |
| 2016/0013079 A1* | 1/2016 | Choi | H01L 21/67051 156/345.21 |
| 2016/0379854 A1* | 12/2016 | Vopat | H01L 21/67109 392/416 |

FOREIGN PATENT DOCUMENTS

| | | |
|---|---|---|
| CN | 104347382 A | 2/2015 |
| JP | 2006005095 A | 1/2006 |
| KR | 100778782 B1 | 11/2007 |

(Continued)

OTHER PUBLICATIONS

Korean Patent Office, Office action dated Aug. 21, 2019.
Korean Patent Office, Notice of Allowance dated Jan. 29, 2020.
China Patent Office, Office action dated Oct. 14, 2022.

*Primary Examiner* — Xiaoming Liu
(74) *Attorney, Agent, or Firm* — Li & Cai Intellectual Property (USA) Office

(57) ABSTRACT

The inventive concept relates to a substrate heating unit. The substrate heating unit includes a chuck stage having an inner space defined by a base and sidewalls, a heating unit provided in the inner space of the chuck stage, and a quartz window that covers the inner space of the chuck stage and has an upper surface on which the substrate is placed. The heating unit includes a heating plate having a disk shape with an opening in the center thereof and heating modules installed in respective heating zones on the heating plate that (Continued)

are divided from each other, each heating module having a printed circuit board on which heating light sources emitting light for heating are mounted.

20 Claims, 19 Drawing Sheets

(56) References Cited

FOREIGN PATENT DOCUMENTS

| KR | 10-0951650 B | 3/2010 |
|---|---|---|
| KR | 1020110090755 A | 8/2011 |
| KR | 1020140064227 A | 5/2014 |
| KR | 1020160008065 A | 1/2016 |
| KR | 10-2017-0104383 A | 9/2017 |
| KR | 10-2017-0135714 A | 12/2017 |
| KR | 10-2018-0014438 A | 2/2018 |

* cited by examiner

SUBSTRATE HEATING UNIT AND SUBSTRATE PROCESSING APPARATUS HAVING THE SAME

CROSS-REFERENCE TO RELATED APPLICATIONS

A claim for priority under 35 U.S.C. § 119 is made to Korean Patent Application No. 10-2018-0043803 filed on Apr. 16, 2018, in the Korean Intellectual Property Office, the entire contents of which are hereby incorporated by reference.

BACKGROUND

Embodiments of the inventive concept described herein relate to a substrate processing apparatus, and more particularly, relate to a substrate processing apparatus for performing a process while heating a substrate during substrate processing.

In general, various processes such as a photoresist coating process, a developing process, an etching process, an ashing process, and the like are performed to process a glass substrate or a wafer in a process of manufacturing a flat panel display device or a semiconductor.

In each process, a wet cleaning process using chemicals or deionized water and a drying process for drying the chemicals or the deionized water remaining on the surface of a substrate are performed to remove various contaminants adhering to the substrate.

In recent years, an etching process of selectively removing a silicon nitride film and a silicon oxide film by using a chemical solution, such as a sulfuric acid or a phosphoric acid, at high temperature has been used.

A substrate heating apparatus for heating a substrate using IR lamps is applied to a substrate processing apparatus using a high-temperature chemical solution to improve an etch rate.

However, the IR lamps of the conventional substrate heating apparatus are arranged at equal intervals, among which the outermost lamp has a smaller size than the substrate and the innermost lamp has a specified size in view of a central nozzle. Therefore, as depicted in the graph of FIG. 1, the light intensity distributions on the edge and the central region of the substrate rapidly fall.

SUMMARY

Embodiments of the inventive concept provide a substrate heating unit for uniformly heating a substrate during substrate processing, and a substrate processing apparatus having the same.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for supporting a substrate includes a chuck stage having an inner space defined by a base and sidewalls, a heating unit provided in the inner space of the chuck stage, and a quartz window that covers the inner space of the chuck stage and has an upper surface on which the substrate is placed. The heating unit includes a heating plate having a disk shape with an opening in the center thereof and heating modules installed in respective heating zones on the heating plate that are divided from each other, each heating module having a printed circuit board on which heating light sources emitting light for heating are mounted.

The heating light sources may emit light for heating the substrate, in different directions according to the heating zones for an improvement in heating uniformity of the substrate.

The heating modules may be parallel or oblique to the substrate, or may be curved with respect to the substrate.

The heating zones may include at least a central zone, a peripheral zone, and at least one intermediate zone therebetween with respect to a distance from the center of the heating plate.

At least one of the central zone, the peripheral zone, and the intermediate zone may be divided into equiangular zones with a predetermined central angle.

The heating zones may include fan-shaped equiangular zones with a predetermined central angle that are divided from each other with respect to the heating plate.

At least one of the heating zones may be inclined or curved to cause the light for heating to be concentrated on a specific region of the substrate.

At least one of the heating zones may be downwardly inclined or convex toward the outside to cause the light for heating to be diffused.

Each of the heating modules may further include a heat rejection member on a bottom side of the printed circuit board.

The heating plate may have a heat rejection structure with a fluid flow channel through which fluid flows, to reject heat generated by the heating modules.

The heating light sources may include light emitting diodes.

The apparatus may further include a rotary part that has a hollow shape and that is combined with the chuck stage to rotate the chuck stage. The heating unit may not be rotated in the chuck stage.

According to an exemplary embodiment, an apparatus for processing a substrate includes a processing vessel that is open at the top, a substrate support unit that is located in the processing vessel and that supports the substrate, a processing liquid supply unit that supplies a processing liquid to the substrate placed on the substrate support unit, and a heating unit that is provided in the substrate support unit and that has a heating plate on which heating modules are mounted, each of which has a printed circuit board on which heating light sources emitting light for heating the substrate are mounted. The heating unit has a first heating zone in which the heating modules illuminating a specific region of the substrate to compensate for temperature of the specific region are arranged and a second heating zone in which the heating modules illuminating a normal region of the substrate other than the specific region are arranged.

A direction of the light for heating that is emitted from the heating modules arranged in the first heating zone may be different from a direction of the light for heating that is emitted from the heating modules arranged in the second heating zone.

The heating modules arranged in the second heating zone may be parallel to the substrate, and the heating modules arranged in the first heating zone may be oblique to the substrate or are curved with respect to the substrate.

The first heating zone may be provided on a concentric circle with respect to the center of the heating plate.

The first heating zone may be at least one of fan-shaped equiangular zones with a predetermined central angle that are divided from each other with respect to the center of the heating plate.

Each of the heating modules may further include a heat rejection member on a bottom side of the printed circuit board.

The heating plate may have a heat rejection structure with a fluid flow channel through which fluid flows, to reject heat generated by the heating modules.

The substrate support unit may include a chuck stage having an inner space defined by a base and sidewalls, a quartz window that covers the inner space of the chuck stage and has an upper surface on which the substrate is placed, and a rotary part that has a hollow space and that is combined with the chuck stage to rotate the chuck stage. The heating unit may not be rotated in the inner space of the chuck stage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
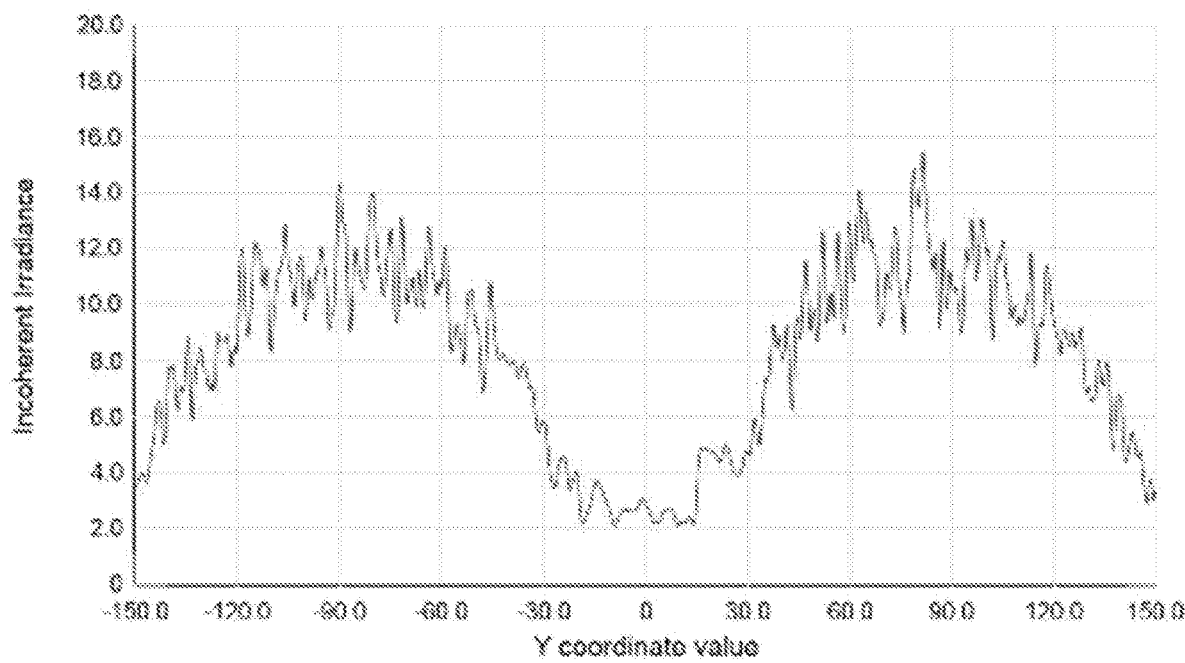
FIG. 1 is a graph depicting a light intensity distribution in a substrate heating apparatus according to the related art.

As the inventive concept allows for various changes and numerous embodiments, exemplary embodiments will be illustrated in the drawings and described in detail in the written description. However, this is not intended to limit the inventive concept to particular modes of practice, and it should be appreciated that all changes, equivalents, and substitutes that do not depart from the spirit and scope of the inventive concept are encompassed in the inventive concept. In describing the inventive concept, detailed descriptions related to well-known functions or configurations will be omitted when they may make subject matters of the inventive concept obscure.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms such as first, second, and the like may be used to describe various components, but the components should not be limited by the terms. The terms may be used only for distinguishing one component from others.

Hereinafter, embodiments according to the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

Figure 2:
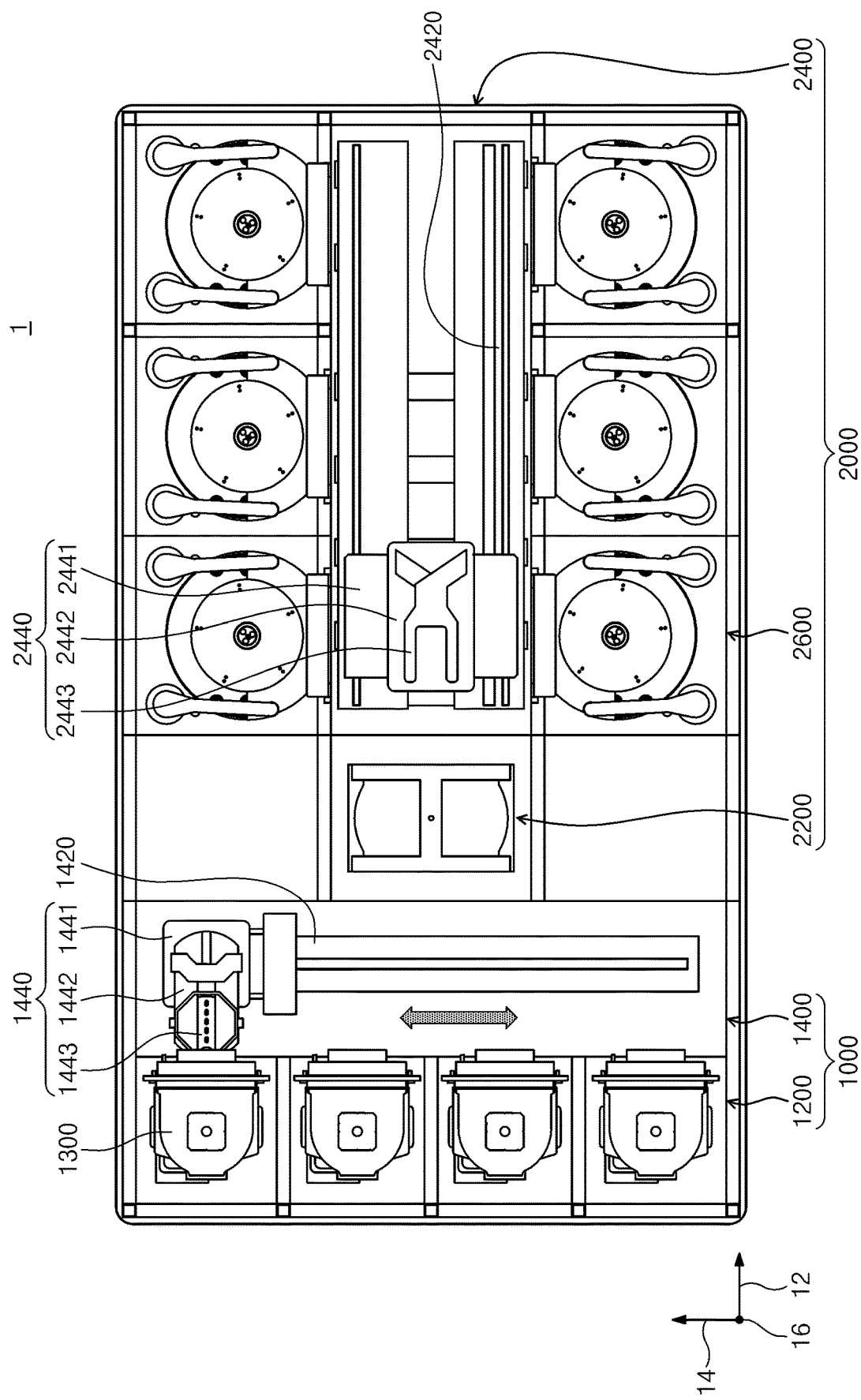
FIG. 2 is a schematic plan view illustrating substrate processing equipment including a substrate processing apparatus according to an embodiment of the inventive concept.

FIG. 2 is a schematic plan view illustrating substrate processing equipment 1 of the inventive concept.

Referring to FIG. 2, the substrate processing equipment 1 includes an index module 1000 and a processing module 2000. The index module 1000 includes a load port 1200 and a transfer frame 1400. The load port 1200, the transfer frame 1400, and the processing module 2000 are sequentially arranged in a row. Hereinafter, the direction in which the load port 1200, the transfer frame 1400, and the processing module 2000 are arranged is referred to as a first direction 12. A direction perpendicular to the first direction 12 when viewed from above is referred to as a second direction 14, and a direction perpendicular to the plane including the first direction 12 and the second direction 14 is referred to as a third direction 16.

A carrier 1300 having substrates W received therein is placed on the load port 1200. The index module 1000 may include a plurality of load ports 1200 arranged in a row along the second direction 14. FIG. 1 illustrates an example that the index module 1000 includes four load ports 1200. However, the number of load ports 1200 may be increased or decreased depending on conditions such as process efficiency and footprint of the processing module 2000. The carrier 1300 has a plurality of slots (not illustrated) that are formed therein to support the edges of the substrates W. The plurality of slots are arranged in the third direction 16. The substrates W are stacked one above another in the carrier 1300 and spaced apart from each other along the third direction 16. A front opening unified pod (FOUP) may be used as the carrier 1300.

The processing module 2000 includes a buffer unit 2200, a transfer chamber 2400, and process chambers 2600. The transfer chamber 2400 is arranged such that the longitudinal direction thereof is parallel to the first direction 12. The process chambers 2600 are disposed on opposite sides of the transfer chamber 2400 along the second direction 14. The process chambers 2600 on one side of the transfer chamber 2400 and the process chambers 2600 on the opposite side of the transfer chamber 2400 are located in a symmetric arrangement with respect to the transfer chamber 2400. Some of the process chambers 2600 are arranged along the longitudinal direction of the transfer chamber 2400. Furthermore, some of the process chambers 2600 are stacked one above another along the third direction 16. That is, the process chambers 2600 may be arranged in an A×B array (A and B being natural numbers of 1 or larger) on each side of the transfer chamber 2400. Here, "A" is the number of process chambers 2600 arranged in a row along the first direction 12, and "B" is the number of process chambers 2600 arranged in a column along the third direction 16. In the case where four or six process chambers 2600 are disposed on each side of the transfer chamber 2400, the process chambers 2600 may be arranged in a 2×2 or 3×2 array. The number of process chambers 2600 may be increased or decreased. Alternatively, the process chambers 2600 may be disposed on only one side of the transfer chamber 2400. In another case, the process chambers 2600 may be arranged in a single layer on the opposite sides of the transfer chamber 2400.

The buffer unit 2200 is disposed between the transfer frame 1400 and the transfer chamber 2400. The buffer unit 2200 provides a space in which the substrates W stay before transferred between the transfer chamber 2400 and the transfer frame 1400. The buffer unit 2200 has a plurality of slots (not illustrated) therein, on which the substrates W are placed. The slots (not illustrated) are spaced apart from each other along the third direction 16. The buffer unit 2200 is open at one side facing the transfer frame 1400 and at an opposite side facing the transfer chamber 2400.

The transfer frame 1400 transfers the substrates W between the butter unit 2200 and the carrier 1300 placed on the load port 1200. The transfer frame 1400 includes an index rail 1420 and an index robot 1440. The index rail 1420 is arranged such that the longitudinal direction thereof is parallel to the second direction 14. The index robot 1440 is mounted on the index rail 1420 and linearly moves along the index rail 1420 in the second direction 14. The index robot 1440 has a base 1441, a body 1442, and an index arm 1443. The base 1441 is movable along the index rail 1420. The body 1442 is combined with the base 1441. The body 1442 is movable along the third direction 16 on the base 1441. Furthermore, the body 1442 is rotatable on the base 1441. The index arm 1443 is combined with the body 1442 and is movable forward and backward relative to the body 1442. The index robot 1440 may include a plurality of index arms 1443 that operate individually. The index arms 1443 are stacked one above another along the third direction 16 with a spacing gap therebetween. Some of the index arms 1443 may be used to transfer substrates W from the processing module 2000 to the carrier 1300, and the other index arms 1443 may be used to transfer substrates W from the carrier 1300 to the processing module 2000. Accordingly, particles generated from substrates W to be processed may be prevented from adhering to processed substrates W in the process in which the index robot 1440 transfers the substrates W between the carrier 1300 and the processing module 2000.

The transfer chamber 2400 transfers substrates W between the buffer unit 2200 and the process chambers 2600 and between the process chambers 2600. The transfer chamber 2400 includes a guide rail 2420 and a main robot 2440. The guide rail 2420 is arranged such that the longitudinal direction thereof is parallel to the first direction 12. The main robot 2440 is mounted on the guide rail 2420 and linearly moves along the first direction 12 on the guide rail 2420. The main robot 2440 has a base 2441, a body 2442, and a main arm 2443. The base 2441 is movable along the guide rail 2420. The body 2442 is combined with the base 2441. The body 2442 is movable along the third direction 16 on the base 2441. Furthermore, the body 2442 is rotatable on the base 2441. The main arm 2443 is combined with the body 2442 and is movable forward and backward relative to the body 2442. The main robot 2440 may include a plurality of main arms 2443 that operate individually. The main arms 2443 are stacked one above another along the third direction 16 with a spacing gap therebetween. The main arms 2443 used to transfer substrates W from the buffer unit 2200 to the process chambers 2600 may differ from the main arm 2443 used to transfer substrates W from the process chambers 2600 to the buffer unit 2200.

The process chambers 2600 have substrate processing apparatuses 10 therein, respectively, which perform cleaning processes on substrates W. The substrate processing apparatuses 10 in the respective process chambers 2600 may have different structures according to the types of cleaning processes that the substrate processing apparatuses 10 perform. Alternatively, the substrate treating apparatuses 10 in the respective process chambers 2600 may have the same structure. In another case, the process chambers 2600 may be divided into a plurality of groups. The substrate processing apparatuses 10 in the process chambers 2600 belonging to the same group may have the same structure, and the substrate processing apparatuses 10 in the process chambers 2600 belonging to different groups may have different structures. For example, in the case where the process chambers 2600 are divided into two groups, a first group of process chambers 2600 may be disposed on the one side of the transfer chamber 2400, and a second group of process chambers 2600 may be disposed on the opposite side of the transfer chamber 2400. Alternatively, on the opposite sides of the transfer chamber 2400, the first group of process chambers 2600 may be disposed in a lower layer, and the second group of process chambers 2600 may be disposed in an upper layer. The first group of process chambers 2600 may be distinguished from the second group of process chambers 2600 according to the types of chemicals used and the types of cleaning methods.

In the following embodiment, an apparatus for cleaning a substrate W using processing fluids, such as a high-temperature sulfuric acid, an alkaline chemical, an acidic chemical, a rinsing solution, and a drying gas, will be described as an example. However, without being limited thereto, the spirit and scope of the inventive concept are applicable to various types of apparatuses that perform a process, such as an etching process, while rotating a substrate W.

Figure 3:
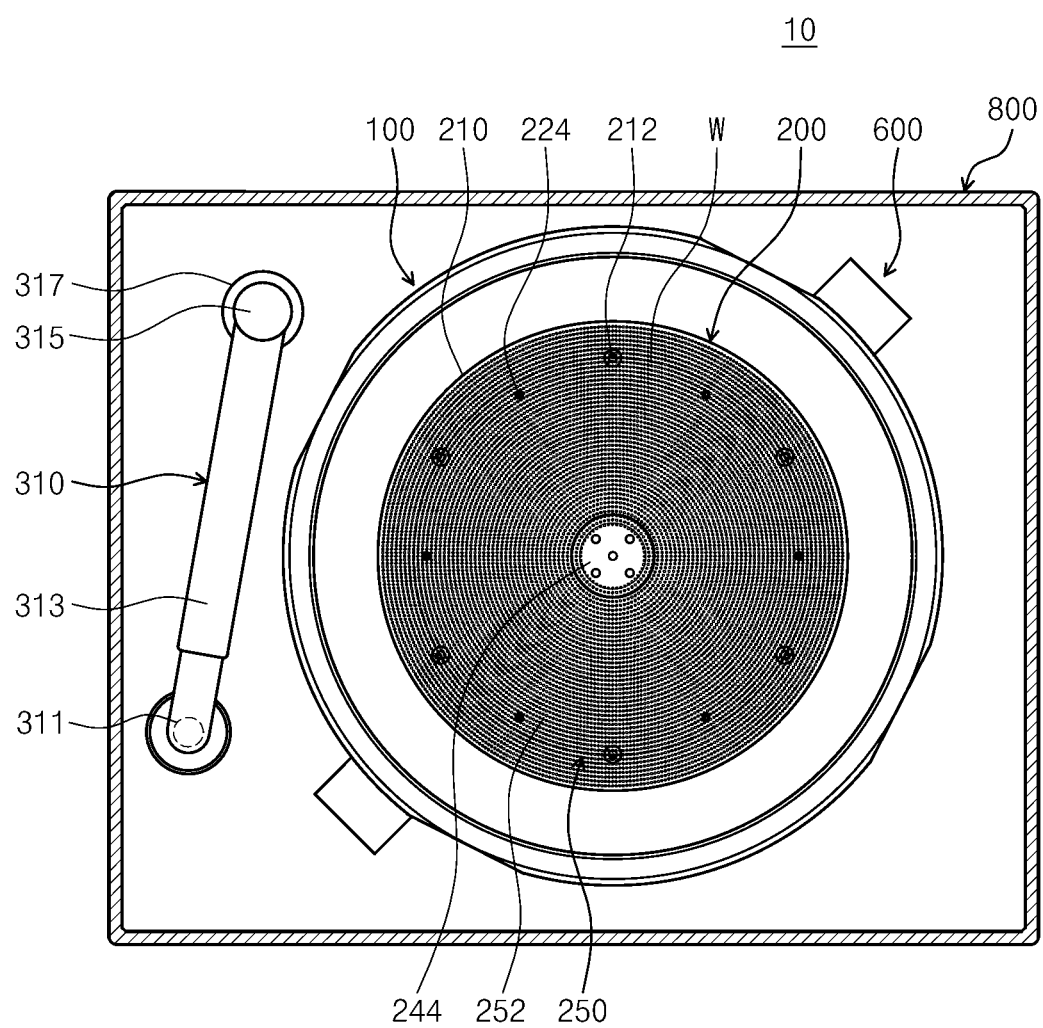
FIG. 3 is a plan view illustrating the substrate processing apparatus of FIG. 2.
Figure 4:
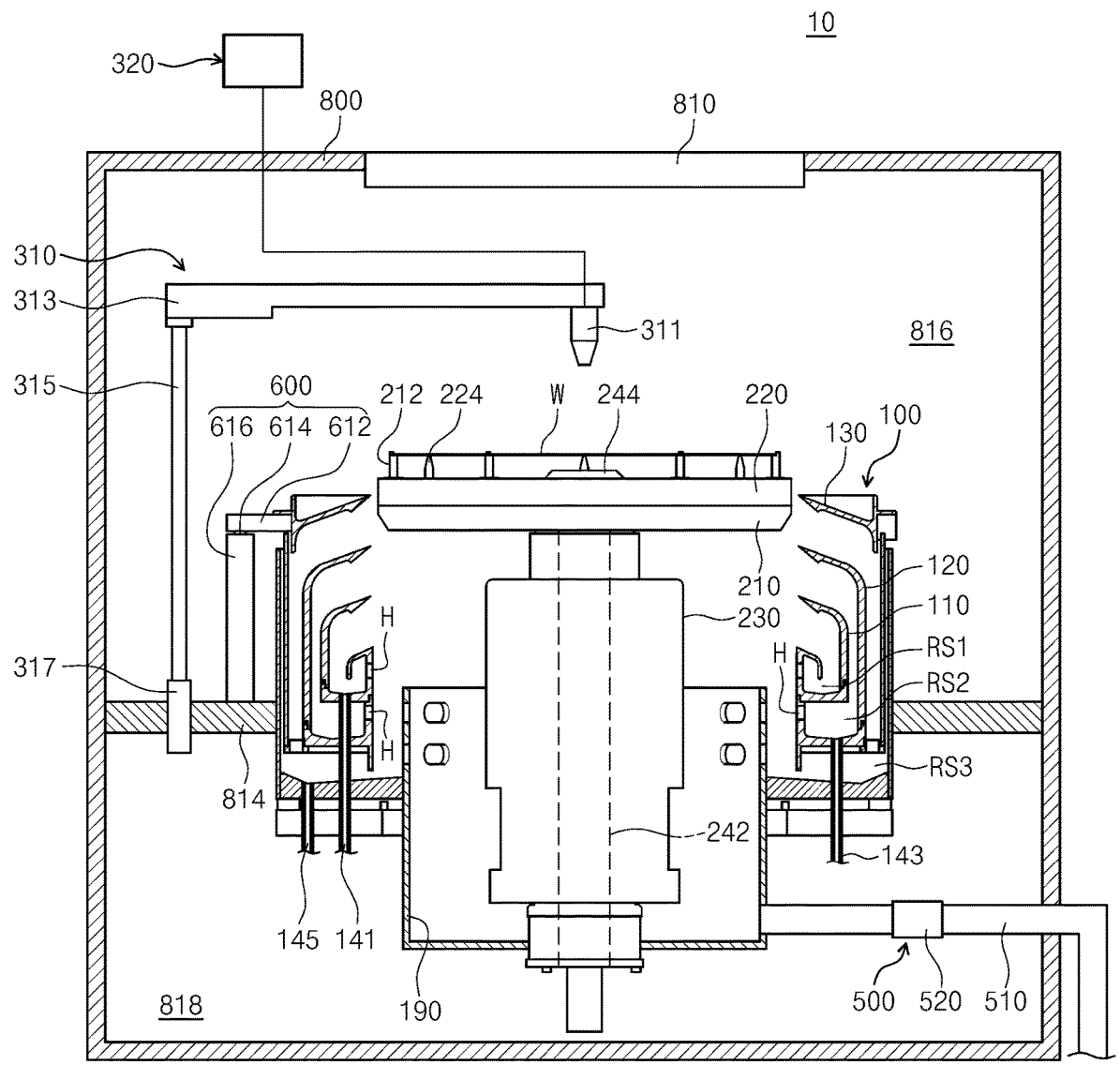
FIG. 4 is a sectional view illustrating the substrate processing apparatus of FIG. 2.

FIG. 3 is a plan view illustrating the substrate processing apparatus 10 of FIG. 2, and FIG. 4 is a sectional view illustrating the substrate processing apparatus 10 of FIG. 2.

Referring to FIGS. 3 and 4, the substrate processing apparatus 10 includes a chamber 800, a processing vessel 100, a substrate support unit 200, a heating unit 900 (illustrated in FIG. 5), a processing liquid supply unit 300, a process exhaust unit 500, and a lifting unit 600.

The chamber 800 has a sealed inner space. The chamber 800 is equipped with an air-flow supply unit 810 at the top thereof. The air-flow supply unit 810 forms a downward flow of air in the chamber 800.

The air-flow supply unit 810 filters and supplies high-humidity outside air into the chamber 800. The high-humidity outside air forms a downdraft while being supplied into the chamber 800 through the air-flow supply unit 810. The downdraft provides a uniform air flow over a substrate W and releases contaminants generated in the process in which the surface of the substrate W is processed by processing fluids, along with air to the process exhaust unit 500 through recovery bowls 110, 120, and 130 of the processing vessel 100.

The chamber 800 is partitioned into a process area 816 and a maintenance area 818 by a horizontal partition wall 814. The processing vessel 100 and the substrate support unit 200 are located in the process area 816. An actuator of the lifting unit 600, an actuator connected with the processing liquid supply unit 300, and a supply line are located in the maintenance area 818, in addition to drain lines 141, 143, and 145 connected with the processing vessel 100 and an exhaust line 510. The maintenance area 818 is isolated from the process area 816.

The processing vessel 100 has an open-topped cylindrical shape and provides a process space for processing the substrate W. The open top side of the processing vessel 100 serves as a passage through which the substrate W is carried into or out of the processing vessel 100. The substrate support unit 200 is located in the process space. The substrate support unit 200 rotates the substrate W while supporting the substrate W during processing.

The processing vessel 100 has, at the bottom thereof, a lower space to which an exhaust duct 190 is connected to perform forced exhaust. The first to third recovery bowls 110, 120, and 130 are disposed in multiple stages in the processing vessel 100 to take in and suction processing liquids and gases scattered from the rotating substrate W.

The first to third annular recovery bowls 110, 120, and 130 have exhaust holes H that connect to one common annular space.

Specifically, each of the first to third recovery bowls 110, 120, and 130 includes a bottom surface having an annular ring shape and a sidewall having a cylindrical shape extending from the bottom surface. The second recovery bowl 120 surrounds the first recovery bowl 110 and is spaced apart from the first recovery bowl 110. The third recovery bowl 130 surrounds the second recovery bowl 120 and is spaced apart from the second recovery bowl 120.

The first to third recovery bowls 110, 120, and 130 have first to third recovery spaces RS1, RS2, and RS3, respectively, into which an air flow containing processing liquids and fumes scattered from the substrate W is introduced. The first recovery space RS1 is defined by the first recovery bowl 110, the second recovery space RS2 is defined by a spacing space between the first recovery bowl 110 and the second recovery bowl 120, and the third recovery space RS3 is defined by a spacing space between the second recovery bowl 120 and the third recovery bowl 130.

The top side of each of the first to third recovery bowls 110, 120, and 130 is open in the center. The first to third recovery bowls 110, 120, and 130 each include an inclined surface that is upwardly inclined such that the distance between the inclined surface and the corresponding bottom surface gradually increases from the connected sidewall to the opening. Processing liquids scattered from the substrate W flow into the recovery spaces RS1, RS2, and RS3 along the top sides of the first to third recovery bowls 110, 120, and 130.

A first processing liquid introduced into the first recovery space RS1 is discharged to the outside through the first recovery line 141. A second processing liquid introduced into the second recovery space RS2 is discharged to the outside through the second recovery line 143. A third processing liquid introduced into the third recovery space RS3 is discharged to the outside through the third recovery line 145.

The processing liquid supply unit 300 discharges a high-temperature chemical for etching the surface of the substrate W. For example, the processing liquid may be a sulfuric acid, a phosphoric acid, or a mixture thereof.

A processing liquid nozzle member 310 includes a nozzle 311, a nozzle arm 313, a support rod 315, and a nozzle actuator 317. The nozzle 311 receives a processing liquid from a supply unit 320. The nozzle 311 discharges the processing liquid to the surface of the substrate W. The nozzle arm 313 extends in one direction, and the nozzle 311 is mounted on the tip end of the nozzle arm 313. The nozzle arm 313 supports the nozzle 311. The support rod 315 is attached to the rear end of the nozzle arm 313. The support rod 315 is located below the nozzle arm 313. The support rod 315 is disposed perpendicular to the nozzle arm 313. The nozzle actuator 317 is provided at a lower end of the support rod 315. The nozzle actuator 317 rotates the support rod 315 about the longitudinal axis of the support rod 315. The nozzle arm 313 and the nozzle 311 swing about the support rod 315 by the rotation of the support rod 315. The nozzle 311 may swing between outside and inside the processing vessel 100. Further, the nozzle 311 may discharge the processing liquid while swinging between the center of the substrate W and the edge region thereof.

The process exhaust unit 500 is responsible for evacuation of the processing vessel 100. For example, the process exhaust unit 500 provides exhaust pressure (suction pressure) to a recovery bowl that recovers a processing liquid during processing, among the first to third recovery bowls 110, 120, and 130. The process exhaust unit 500 includes the exhaust line 510 connected with the exhaust duct 190 and a damper 520. The exhaust line 510 receives exhaust pressure from an exhaust pump (not illustrated) and is connected with a main exhaust line buried beneath the floor of a semiconductor manufacturing line.

The processing vessel 100 is combined with the lifting unit 600 for changing the vertical location of the processing vessel 100. The lifting unit 600 linearly moves the processing vessel 100 in the vertical direction. The height of the processing vessel 100 relative to the substrate support unit 200 is varied as the processing vessel 100 moves upward and downward.

The lifting unit 600 includes a bracket 612, a moving shaft 614, and an actuator 616. The bracket 612 is fixedly attached to the outer wall of the processing vessel 100. The moving shaft 614, which is vertically moved by the actuator 616, is fixedly coupled to the bracket 612. When the substrate W is loaded on, or unloaded from, a chuck stage 210, the processing vessel 100 moves downward to allow the chuck stage 210 to further protrude upward beyond the processing vessel 100. Furthermore, during processing, the height of the processing vessel 100 is adjusted according to the types of processing liquids supplied to the substrate W, to allow the processing liquids to be introduced into the preset recovery bowls 110, 120, and 130, respectively. The vertical location of the processing vessel 100 relative to the substrate W is varied. The processing vessel 100 may vary the types of processing liquids and pollutant gases recovered into the respective recovery spaces RS1, RS2, and RS3. According to an embodiment, the lifting unit 600 vertically moves the processing vessel 100 to vary the vertical location of the processing vessel 100 relative to the substrate support unit 200.

Figure 5:
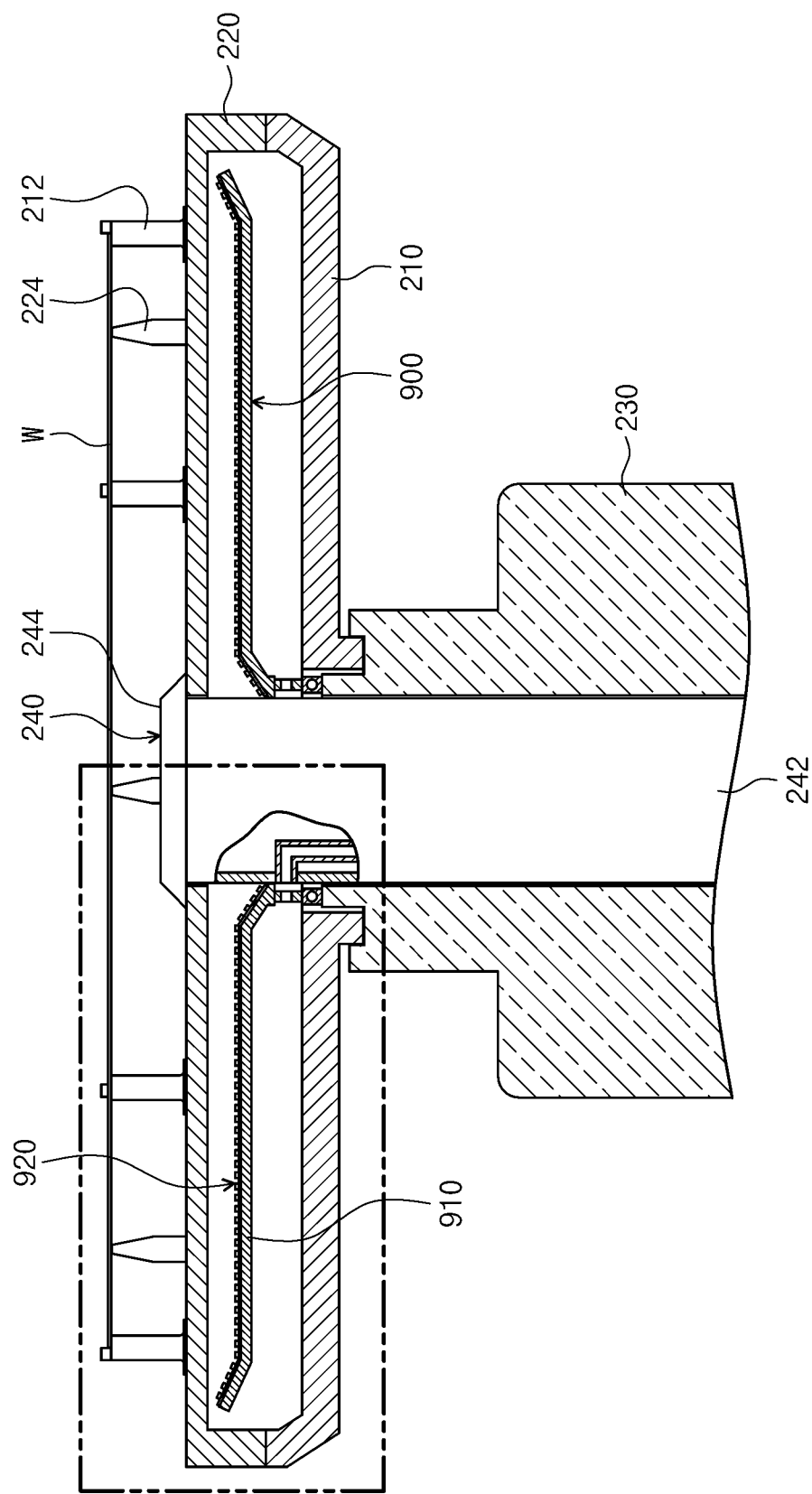
FIG. 5 is a sectional view illustrating a substrate support unit and a heating unit of FIG. 3.
Figure 6:
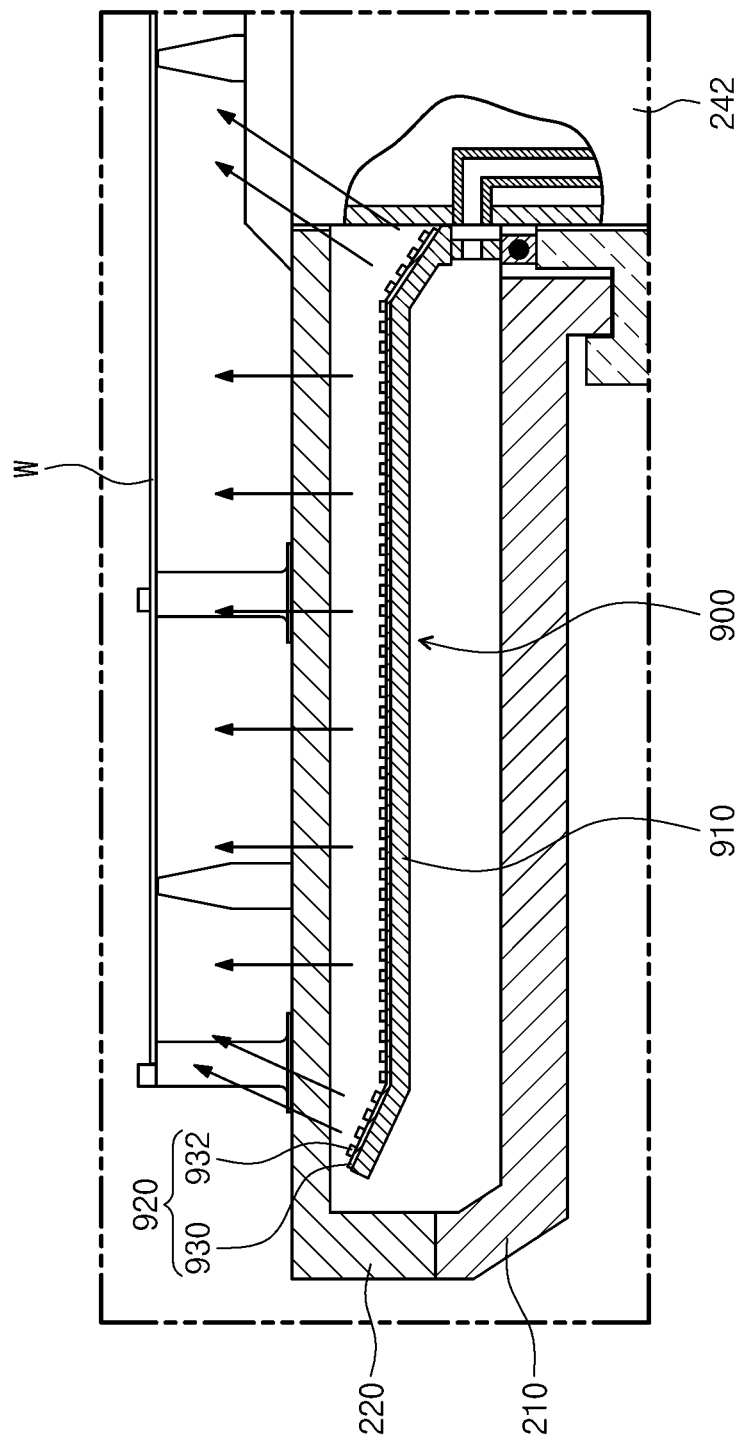
FIG. 6 is a blowup of part of the heating unit of FIG. 5.

FIG. 5 is a sectional view illustrating the substrate support unit 200 and the heating unit 900 of FIG. 3, and FIG. 6 is a blowup of part of the heating unit 900 of FIG. 5.

Referring to FIGS. 3 to 6, the substrate support unit 200 supports the substrate W during processing. The substrate support unit 200 may be rotated by a rotary part 230 during processing.

The substrate support unit 200 includes the chuck stage 210, a quartz window 220, the rotary part 230, a back nozzle 240, and the heating unit 900.

The chuck stage 210 has a circular upper surface. The chuck stage 210 is combined with and rotated by the rotary part 230. Chucking pins 212 are installed at the edge of the chuck stage 219. The chucking pins 212 protrude above the quartz window 220 through the quartz window 220. The chucking pins 212 align the substrate W to locate the substrate W, which is supported by a plurality of support pins 224, in a correct position. During processing, the chucking pins 212 make contact with the side of the substrate W to prevent the substrate W from deviating from the correct position.

The rotary part 230 has a hollow shape. The rotary part 230 is combined with the chuck stage 210 and rotates the chuck stage 210.

The quartz window 220 is located on the chuck stage 210. The quartz window 220 protects the heating unit 900. The quartz window 220 may be transparent. The quartz window 220 may be rotated together with the chuck stage 210. The quartz window 220 includes the support pins 224. The support pins 224 are arranged on a peripheral portion of an upper surface of the quartz window 220 with a predetermined interval therebetween. The support pins 224 protrude upward from the quartz window 220. The support pins 224 support the bottom side of the substrate W to space the substrate W apart upward from the quartz window 220.

The back nozzle 240 sprays a chemical to the back side of the substrate W. The back nozzle 240 includes a nozzle body 242 and a chemical spray part 244. The chemical spray part 244 is located on a central portion of the quartz window 220. The nozzle body 242 is axially inserted through the hollow rotary part 230. The nozzle body 242 may have a chemical delivery line, a gas supply line, and a purge gas supply line therein. The chemical delivery line supplies an etchant for etching the back side of the substrate W to the chemical spray part 244. The gas supply line supplies a nitrogen gas for adjustment of etch uniformity to the back side of the substrate W. The purge gas supply line supplies a nitrogen purge gas to prevent the etchant from infiltrating between the quartz window 220 and the nozzle body 242.

The heating unit 900 is mounted in the substrate support unit 200. The heating unit 900 heats the substrate W during processing. The heating unit 900 is a heating apparatus that uses a 2D array of light emitting diodes (LEDs) as light sources. The LEDS used in the heating unit 900 of the inventive concept have a high degree of freedom in arrangement, enable a selection of various wavelengths, have a flexible printed circuit board, and are capable of varying the range (form) and direction of emitted light according to a lens attached thereto (not illustrated).

According to an embodiment, the heating unit 900 includes a heating plate 910 and heating modules 920.

The heating modules 920 may include a printed circuit board 930 on which a plurality of high-power LEDs 932 are mounted. The LEDs 932 emit light of wavelength(s) that can be easily absorbed into the substrate W. The density of the LEDs 932 on the printed circuit board 930 is not limited to that in this embodiment. The LEDs 932 may be arranged in a plurality of concentric circles, and each of the circles may or may not have the same number of LEDs. In specific embodiments, the number of LEDs 932 in each of the concentric circles may be related to the radius of a specific circle, and outer concentric circles may have more LEDs than inner concentric circles. The pattern of the LEDs 932 is not limited to that in this embodiment, and the number of concentric circles may differ from that illustrated above. The LEDs 932 may be electrically connected to a power supply (not illustrated) through the printed circuit board 930.

The printed circuit board 930 may be physically attached to the heating plate 910, for example, by screws or more fastening means (not illustrated). The fastening means may ensure physical contact between the top side of the heating plate 910 and the bottom side of the printed circuit board 930 to ensure heat conduction.

The heating plate 910 may have a circular shape with the same diameter as, or a larger diameter than, that of the substrate W supported on the substrate support unit 200. For example, in an embodiment, the substrate W may have a diameter of 300 mm, and the array of the LEDs 932 of the heating modules 920 mounted on the heating plate 910 may have a diameter of more than 300 mm to ensure uniform heating.

The heating plate 910 may be mounted on the nozzle body 242 installed through the central space of the rotary part 230. The heating plate 910 may be of a stationary type that does not rotate together with the chuck stage 210.

The heating plate 910 has, in the center thereof, an opening 912 through which the nozzle body 242 is inserted.

Figure 7:
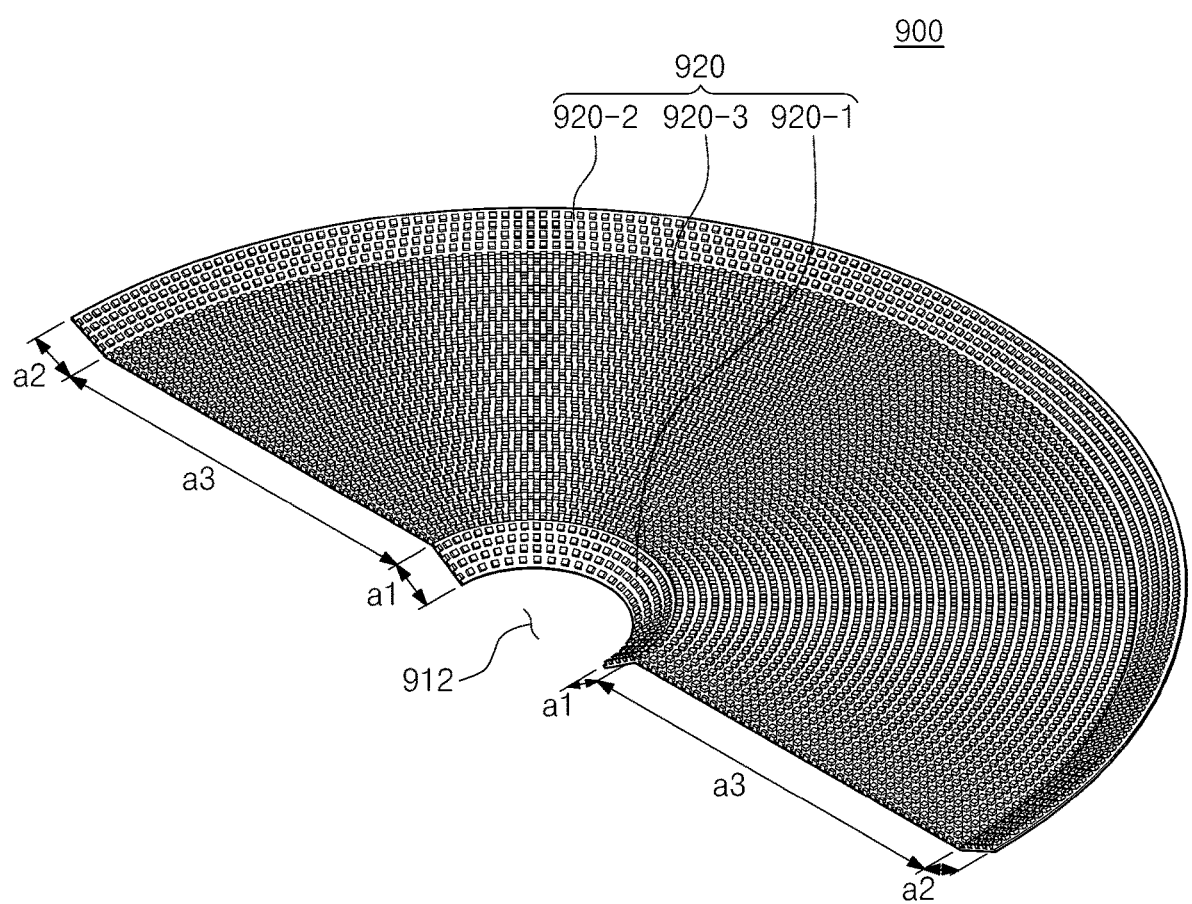
FIG. 7 is a sectional perspective view illustrating the heating unit illustrated in FIG. 6.
Figure 8:
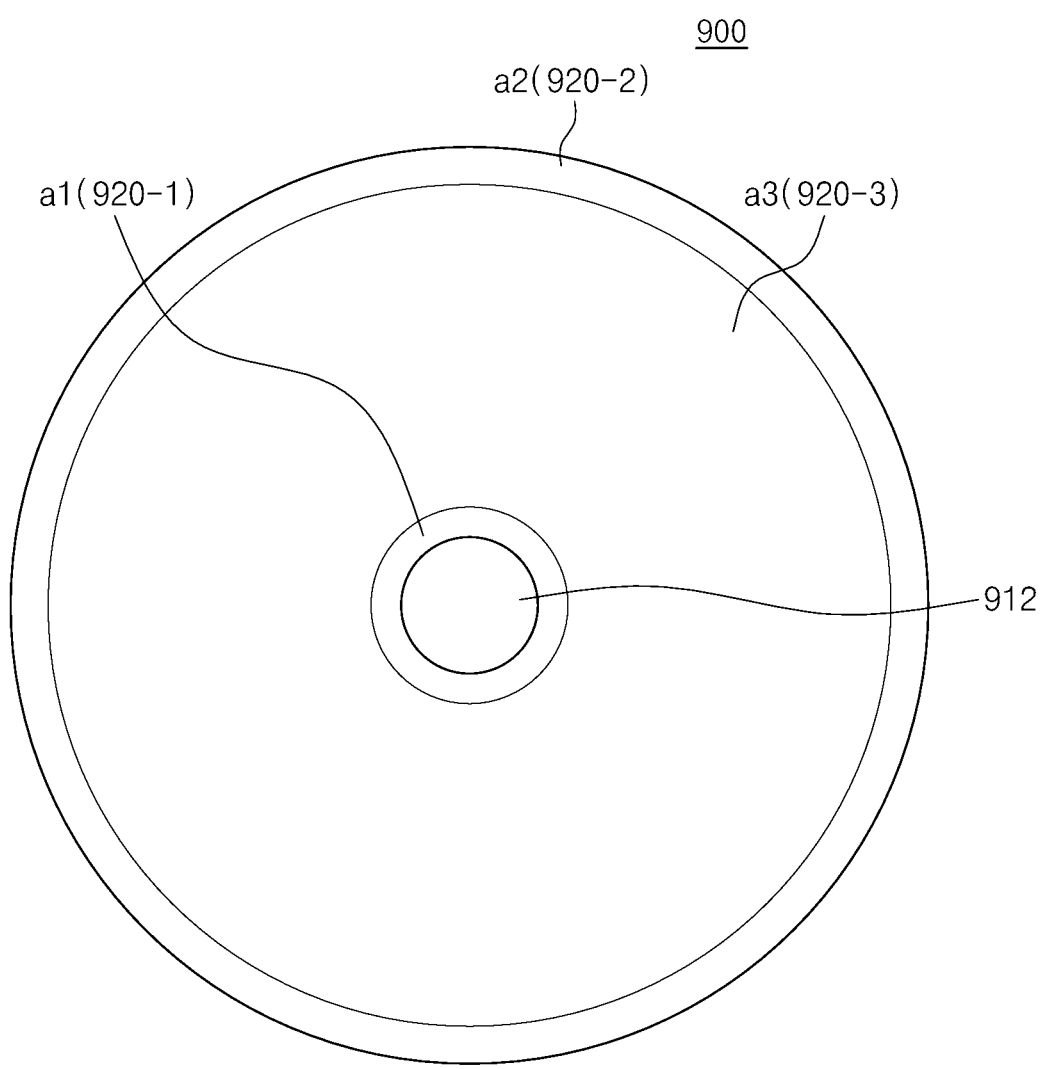
FIG. 8 is a view illustrating heating zones in the heating unit illustrated in FIG. 6.

FIG. 7 is a sectional perspective view illustrating the heating unit 900 illustrated in FIG. 6, and FIG. 8 is a view illustrating heating zones in the heating unit 900 illustrated in FIG. 6. For convenience of drawing, the heating modules 920 are omitted from FIG. 8.

Referring to FIGS. 6 to 8, the heating unit 900 may be divided into a plurality of heating zones for an improvement in temperature distribution of the substrate W. The heating unit 900 may be divided into heating zones in various ways, based on regions of the substrate W where a temperature deviation is more likely to occur theoretically, experimentally, or probabilistically. The heating zones may preferably be provided such that light of the LEDs 932 for heating is concentrated on an edge region and a central region of the substrate W that have a relatively low temperature deviation. That is, heating zones for heating specific regions (the edge region and the central region) of the substrate W may be inclined or curved.

In this embodiment, the heating zones may include at least a central zone a1, a peripheral zone a2, and at least one intermediate zone a3 therebetween with respect to the distance from the center of the heating plate 910, thereby improving thermal uniformity.

The heating unit 900 includes heating modules 920-1, 920-2, and 920-3 divided from each other. The heating modules 920-1, 920-2, and 920-3 may be installed in the corresponding heating zones (the central zone a1, the intermediate zone a3, and the peripheral zone a2), respectively. FIG. 7 illustrates the heating zones a1, a2, and a3 where the heating modules 920-1, 920-2, and 920-3 are disposed, respectively. Among the heating zones a1, a2, and a3, the central zone a1 and the peripheral zone a2 that illuminate the specific regions of the substrate W may be formed to be inclined, and the intermediate zone a3 that illuminates a normal region of the substrate W other than the specific regions may be formed to be parallel to the substrate W. The central zone a1 and the peripheral zone a2 may concentrate light for heating on the specific regions with a relatively low temperature distribution, thereby compensating for temperature.

Figure 9A:
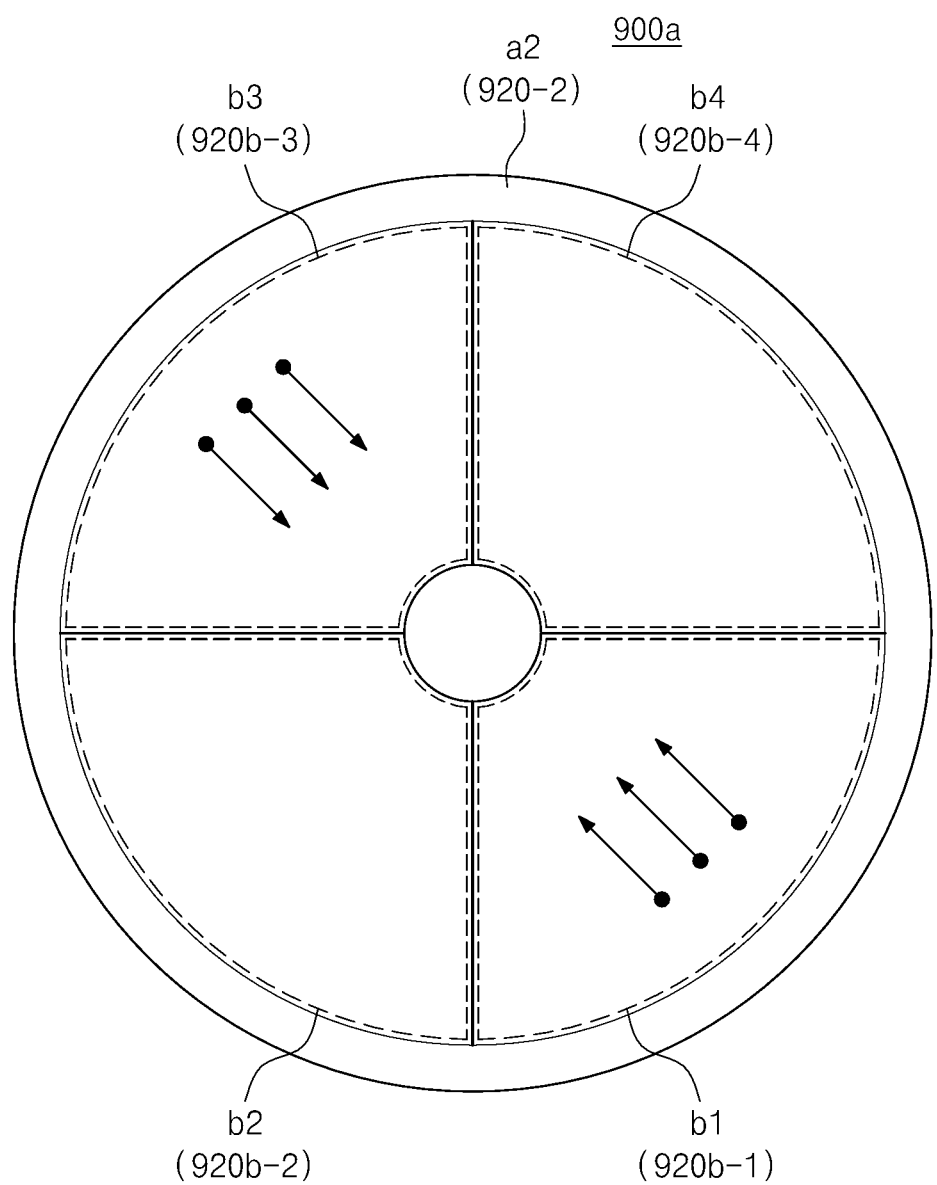
FIGS. 9A and 9B are views illustrating a heating unit according to a first modified example.
Figure 9B:
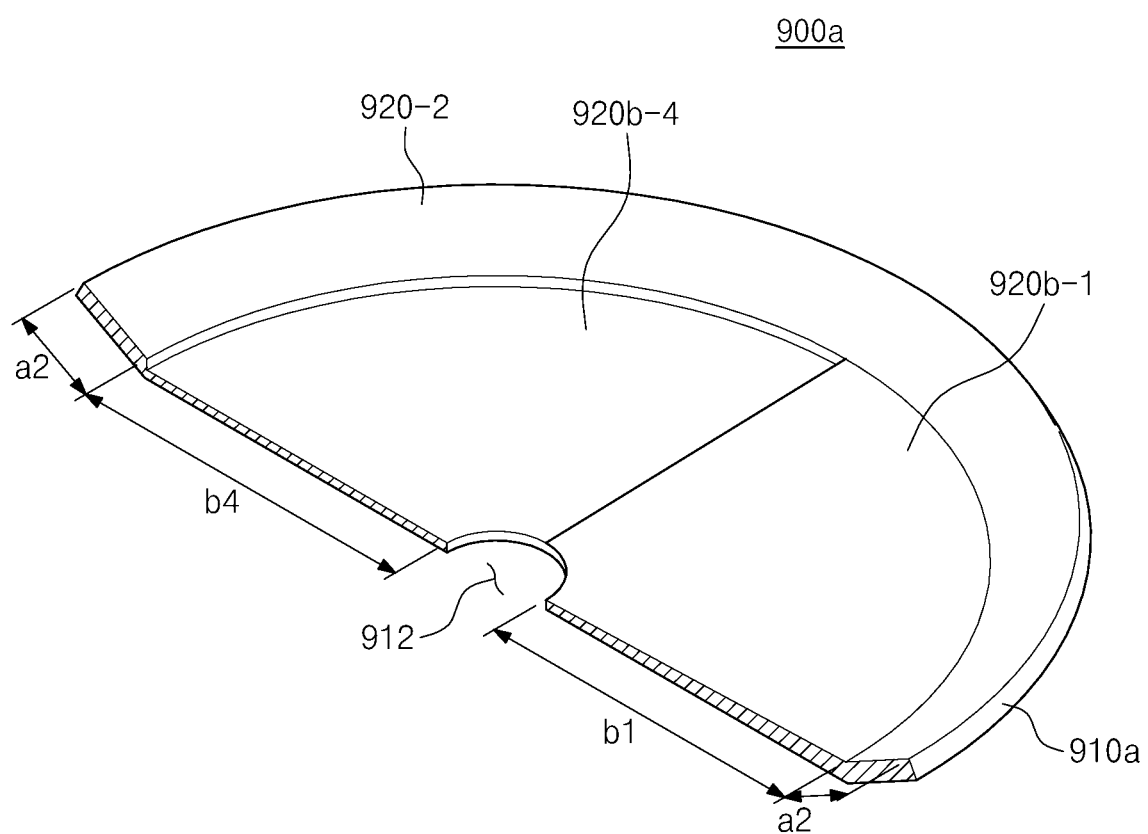

FIGS. 9A and 9B are views illustrating a heating unit 900a according to a first modified example.

For convenience of drawing, detailed surfaces of heating modules 920-2, 920b-1, 920b-2, 920b-3, and 920b-4 are omitted from FIGS. 9A and 9B.

The heating unit 900a according to the first modified example includes a heating plate 910a and the heating modules 920-2, 920b-1, 920b-2, 920b-3, and 920b-4. The heating plate 910a and the heating modules 920-2, 920b-1, 920b-2, 920b-3, and 920b-4 have configurations and functions substantially similar to those of the heating plate 910 and the heating modules 920 illustrated in FIG. 6. Therefore, the following description of the first modified example will be focused on the difference therebetween.

In the first modified example, heating zones of the heating unit 900a may include fan-shaped equiangular zones b1, b2, b3, and b4 with a predetermined central angle (e.g., 90 degrees) that are divided from each other with respect to the heating plate 910a and a peripheral zone a2 surrounding the equiangular zones b1, b2, b3, and b4, thereby improving thermal uniformity.

Especially, among the four equiangular zones b1, b2, b3, and b4, two equiangular zones b1 and b3 facing each other may be formed to be upwardly inclined toward the edge, and the remaining two equiangular zones b2 and b4 may be formed to be horizontal. The peripheral zone a2 may be formed to be inclined toward the edge region of the substrate W.

Although the heating unit 900a according to the first modified example is divided into the four equiangular heating zones with the central angle of 90 degrees, the inventive concept is not limited thereto, and the heating unit 900a may be divided into three, four, or more equiangular zones.

Figure 10:
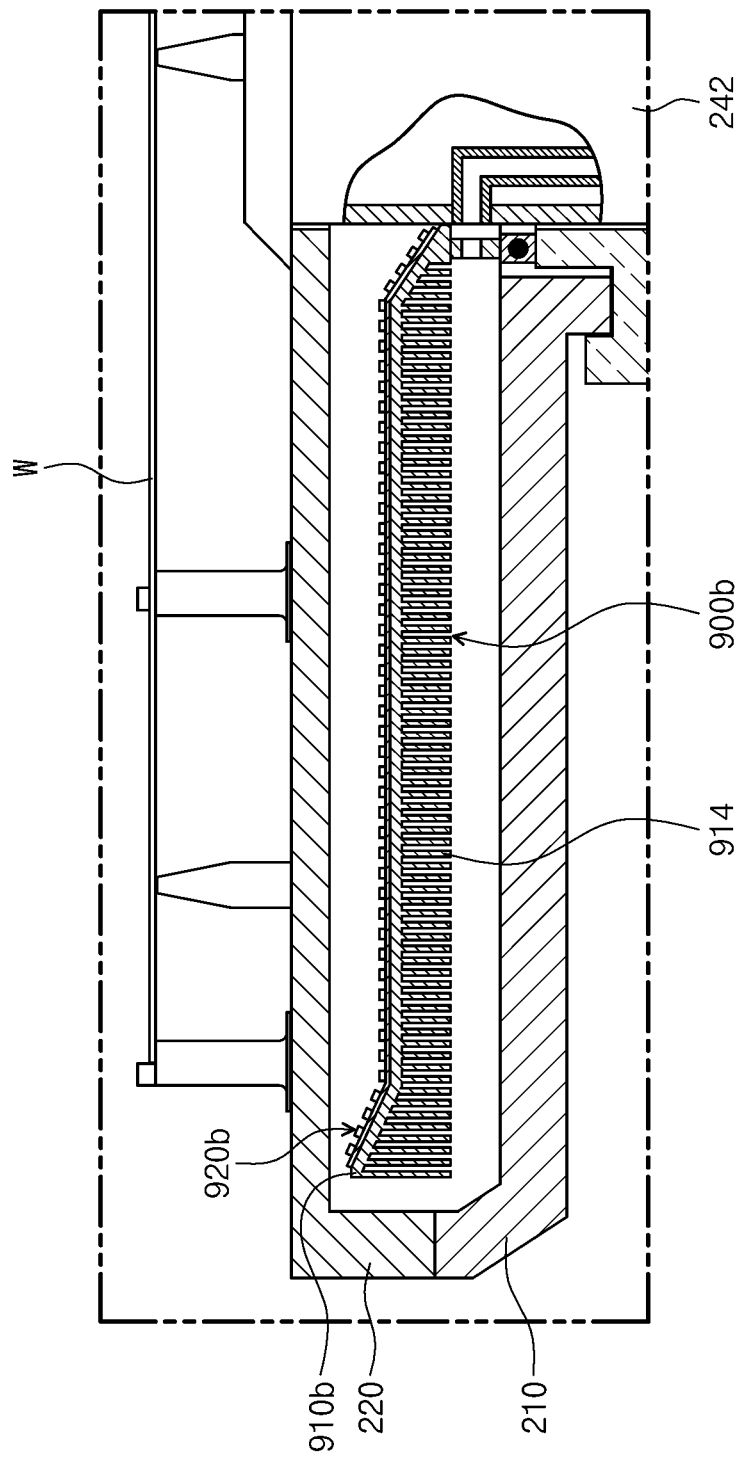
FIG. 10 is a view illustrating a heating unit according to a second modified example.

FIG. 10 is a view illustrating a heating unit 900b according to a second modified example.

The heating unit 900b according to the second modified example includes a heating plate 910b and heating modules 920b. The heating plate 910b and the heating modules 920b have configurations and functions substantially similar to those of the heating plate 910 and the heating modules 920 illustrated in FIG. 6. Therefore, the following description of the second modified example will be focused on the difference therebetween.

In the second modified example, the heating plate 910b of the heating unit 900b is characterized by a heat rejection structure having a fluid flow channel between heat rejection fins 914 to reject heat generated by the heating modules 920b. The heat generated by the heating modules 920b is conducted to the heating plate 910b and rejected through the heat rejection fins 914 formed on the bottom side of the heating plate 910b.

Figure 11:
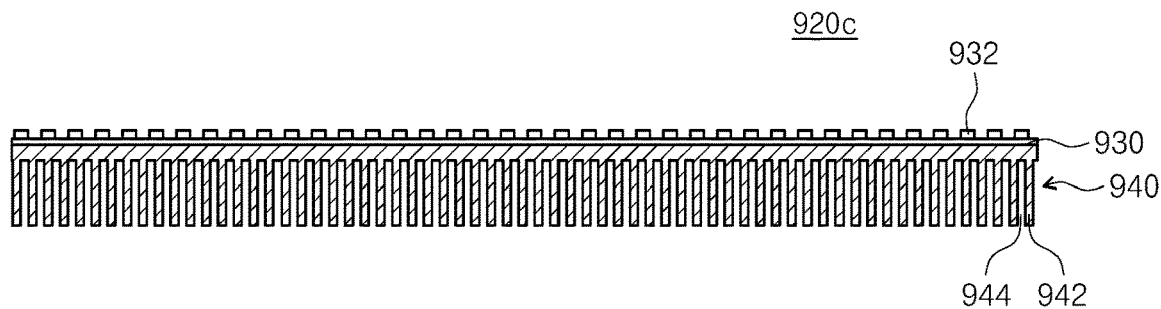
FIGS. 11 and 12 are views illustrating other examples of a heating module.
Figure 12:
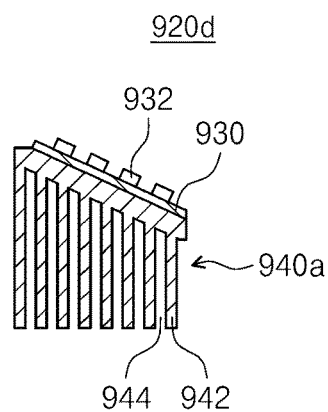

FIGS. 11 and 12 are views illustrating modified examples of the heating modules 920b.

A heating module 920c according to a modified example includes a printed circuit board 930 on which a plurality of high-power LEDs 932 are mounted and a heat rejection member 940 on the bottom side of the printed circuit board 930. The heat rejection member 940 may have a fluid flow channel 944 formed between heat rejection fins 942.

As illustrated in FIG. 11, the heat rejection member 940 may have the same length. In this case, the LEDs 932 are horizontally arranged.

A heating module 920d of FIG. 12 includes a heat rejection member 940a that has a gradually decreasing length from one side to the other side. In this case, LEDs 932 are obliquely arranged.

Figure 13:
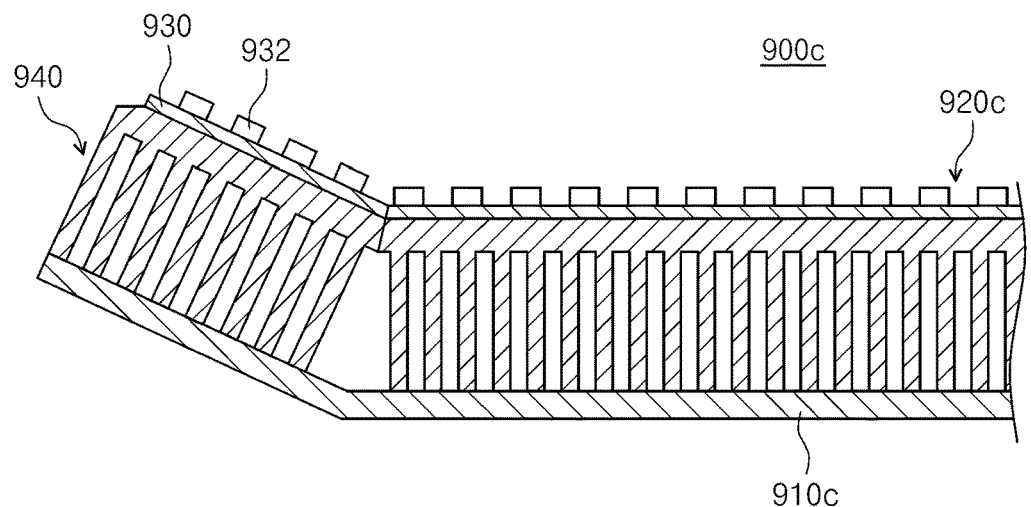
FIG. 13 is a view illustrating a heating unit according to a third modified example to which the heating module illustrated in FIG. 11 is applied.

FIG. 13 is a view illustrating a heating unit 900c according to a third modified example to which the heating module 920c illustrated in FIG. 11 is applied.

The heating unit 900c according to the third modified example includes a heating plate 910c and the heating modules 920c. The heating plate 910c and the heating modules 920c have configurations and functions substantially similar to those of the heating plate 910 and the heating modules 920 illustrated in FIG. 6. Therefore, the following description of the third modified example will be focused on the difference therebetween.

In the third modified example, the heating modules 920c may have a heat rejection member. The heat rejection member may be mounted on the heating plate 910c.

Figure 14:
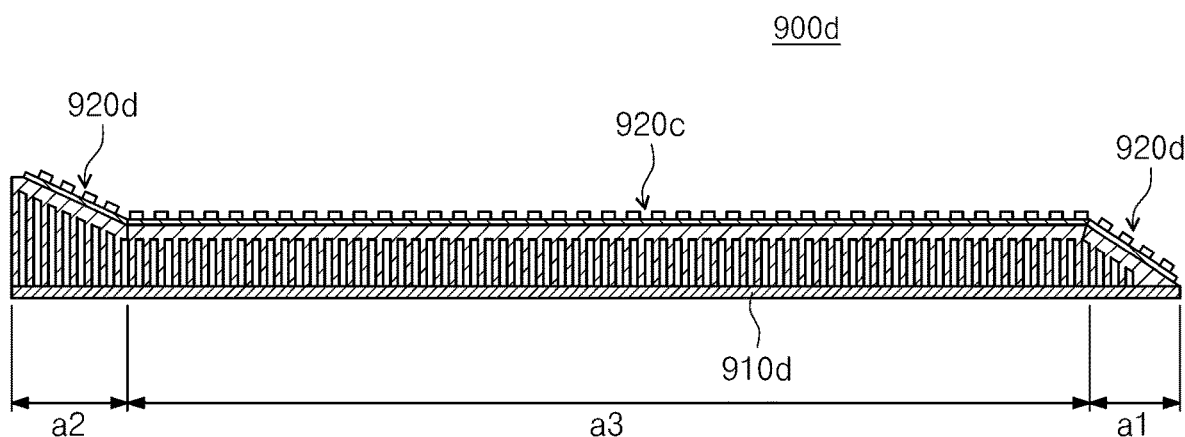
FIG. 14 is a view illustrating a heating unit according to a fourth modified example to which the heating modules illustrated in FIGS. 11 and 12 are applied.

FIG. 14 is a view illustrating a heating unit 900d according to a fourth modified example to which the heating modules 920c and 920d illustrated in FIGS. 11 and 12 are applied.

The heating unit 900d according to the fourth modified example includes a heating plate 910d and the heating modules 920c and 920d. The heating plate 910d and the heating modules 920c and 920d have configurations and functions substantially similar to those of the heating plate 910 and the heating modules 920 illustrated in FIG. 6. Therefore, the following description of the fourth modified example will be focused on the difference therebetween.

In the fourth modified example, the heating plate 910d may have a plate shape with the same plane as a whole. The heating module 920d illustrated in FIG. 12 may be mounted on a peripheral zone a2 and a central zone a1 of the heating plate 910d, and the heating module 920c illustrated in FIG. 11 may be mounted on an intermediate zone a3 of the heating plate 910d.

The heating unit 900d according to the fourth modified example uses the heating module 920d having the inclined printed circuit board, thereby concentrating light for heating on the specific regions of the substrate W.

Figure 15:
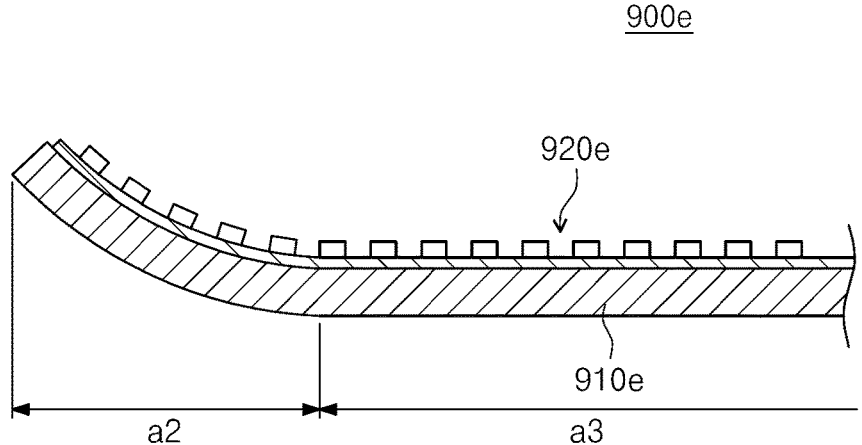
FIG. 15 is a view illustrating a heating unit according to a fifth modified example.

FIG. 15 is a view illustrating a heating unit 900e according to a fifth modified example.

The heating unit 900e according to the fifth modified example includes a heating plate 910e. Among heating zones of the heating plate 910e, a central zone a1 and a peripheral zone (not illustrated) that illuminate the specific regions of the substrate W may be curved, and an intermediate zone a3 that illuminates a normal region of the substrate W other than the specific regions may be formed to be parallel to the substrate W.

The central zone a1 and the peripheral zone (not illustrated) concentrate light for heating on the specific regions with a relatively low temperature distribution, thereby compensating for temperature.

Figure 16:
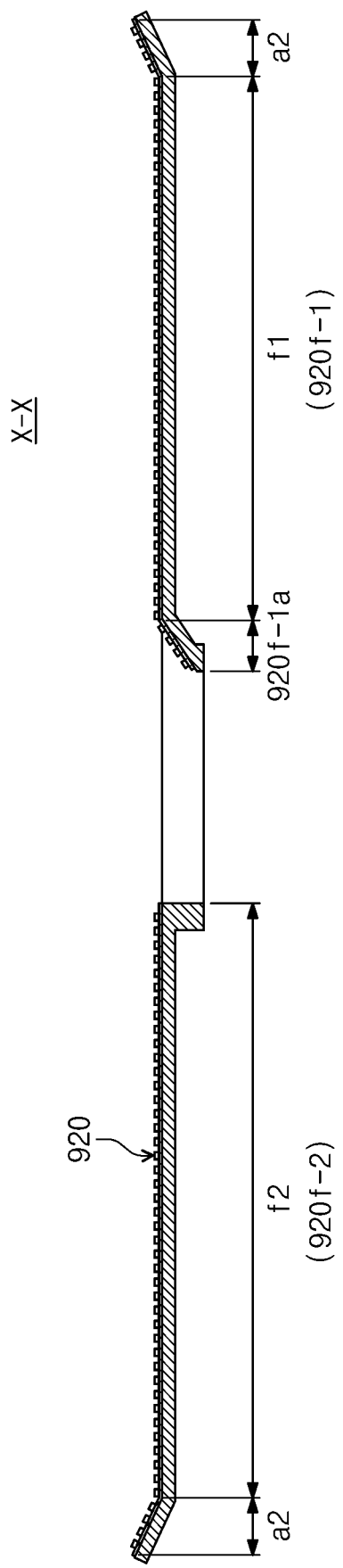
FIGS. 16 and 17 are views illustrating a heating unit according to a sixth modified example.
Figure 17:
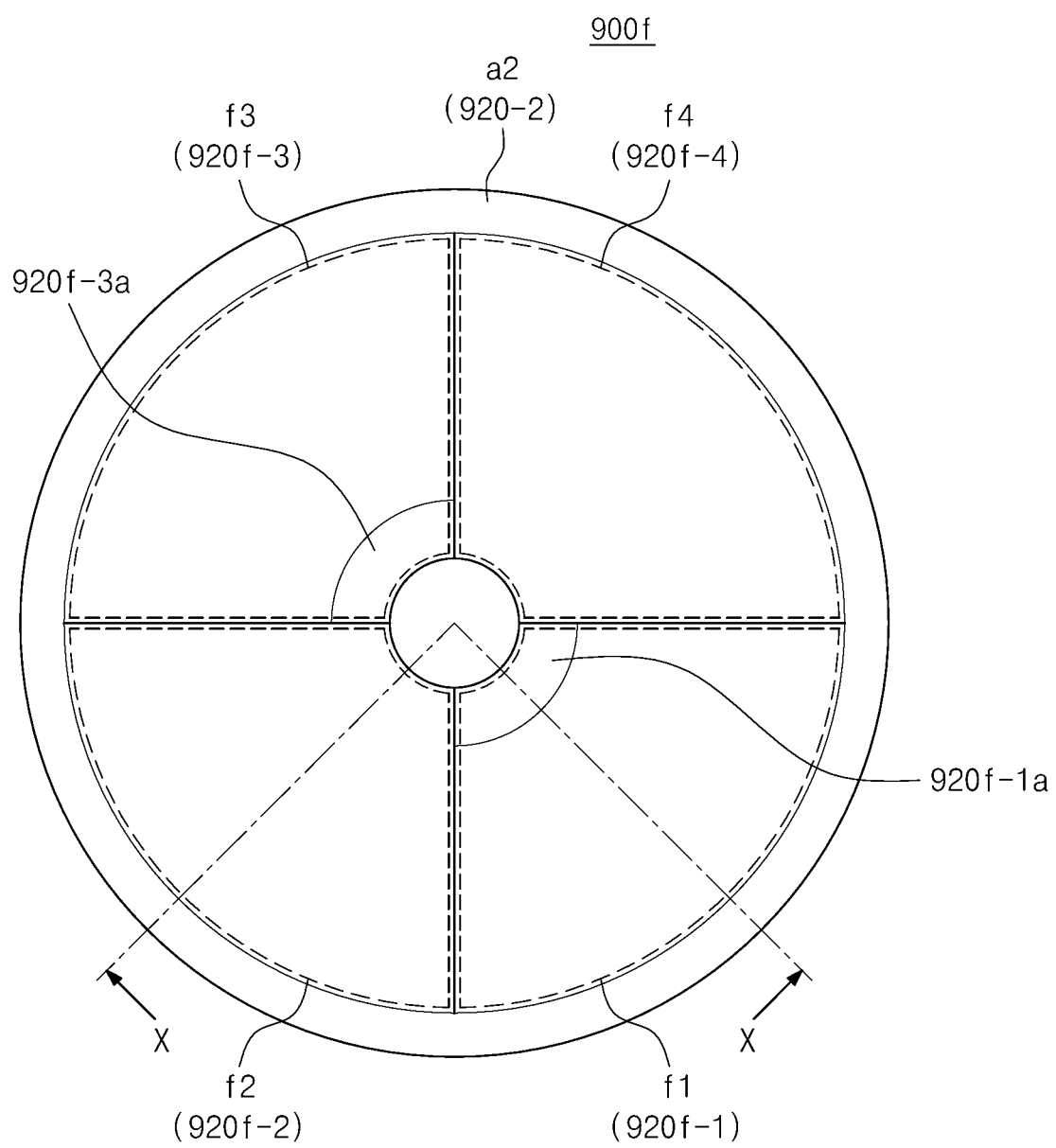

FIGS. 16 and 17 are views illustrating a heating unit 900f according to a sixth modified example.

For convenience of drawing, detailed surfaces of heating modules 920-2, 920f-1, 920f-2, 920f-3, 920f-4, 920f-1a, and 920f-3a are omitted from FIG. 17. FIG. 16 is a sectional view taken along line X-X of FIG. 17.

The heating unit 900f according to the sixth modified example includes a heating plate 910f and the heating modules 920-2, 920f-1, 920f-2, 920f-3, 920f-4, 920f-1a, and 920f-3a. The heating plate 910f and the heating modules 920-2, 920f-1, 920f-2, 920f-3, 920f-4, 920f-1a, and 920f-3a have configurations and functions substantially similar to those of the heating plate 910 and the heating modules 920 illustrated in FIG. 6. Therefore, the following description of the sixth modified example will be focused on the difference therebetween.

In the sixth modified example, heating zones of the heating unit 900f may include fan-shaped equiangular zones f1, f2, f3, and f4 with a predetermined central angle (e.g., 90 degrees) that are divided from each other with respect to the heating plate 910f and a peripheral zone a2 surrounding the equiangular zones f1, f2, and f4. Among the four equiangular zones f1, f2, f3, and f4, two equiangular zones f1 and f3 facing each other include central zones, and the heating modules 920f-1a and 920f-3a are installed in the central zones, respectively, thereby improving thermal uniformity.

Figure 18:
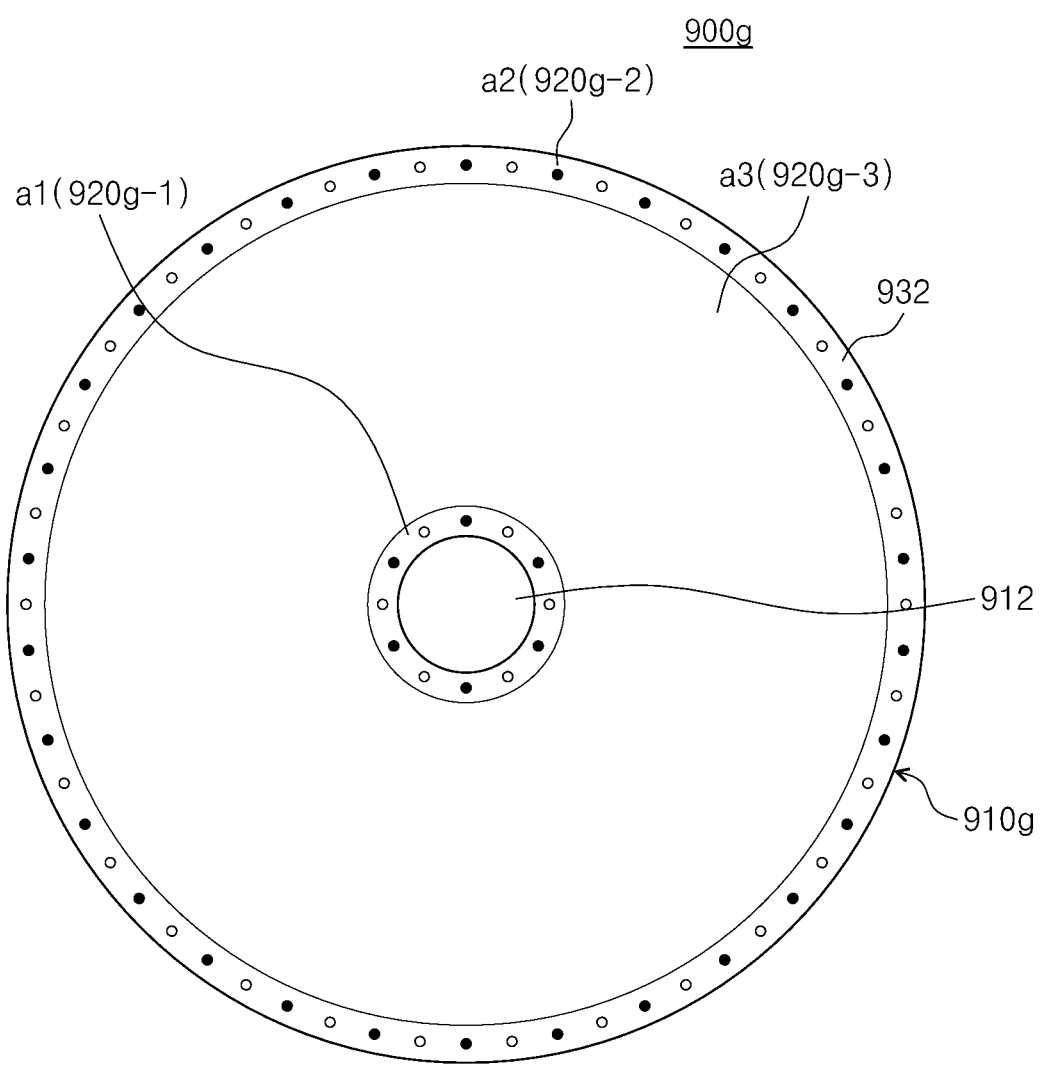
FIG. 18 is a view illustrating a heating unit according to a seventh modified example.

FIG. 18 is a view illustrating a heating unit 900g according to a seventh modified example.

For convenience of drawing, detailed surfaces of heating modules 920g-1, 920g-2, and 920g-3 are omitted from FIG. 18.

The heating unit 900g according to the seventh modified example includes a heating plate 910g having a central zone a1, a peripheral zone a2, and at least one intermediate zone a3 therebetween and the heating modules 920g-1, 920g-2, and 920g-3 installed in the heating zones a1, a2, and a3, respectively. The heating plate 910g and the heating modules 920g-1, 920g-2, and 920g-3 have configurations and functions substantially similar to those of the heating plate 910 and the heating modules 920 illustrated in FIG. 8. Therefore, the following description of the seventh modified example will be focused on the difference therebetween.

The heating unit 900g according to the seventh modified example is characterized in that some of LEDs 932 of the heating modules 920g-1 and 920g-2 located in the central zone a1 and the peripheral zone a2 emit light in a different direction. For example, LEDs 932 displayed in black in FIG. 18 emit light in a direction perpendicular to the substrate W, and LEDs 932 displayed in white emit light in a direction inclined at an angle of 45 degrees with respect to the substrate W, thereby improving thermal uniformity (for convenience of drawing, LEDs of the heating module 920g-3 located in the intermediate zone a3 are omitted). Although the arrangement of the LEDs is schematically illustrated in FIG. 18 for convenience of drawing, the inventive concept is not limited thereto.

Figure 19:
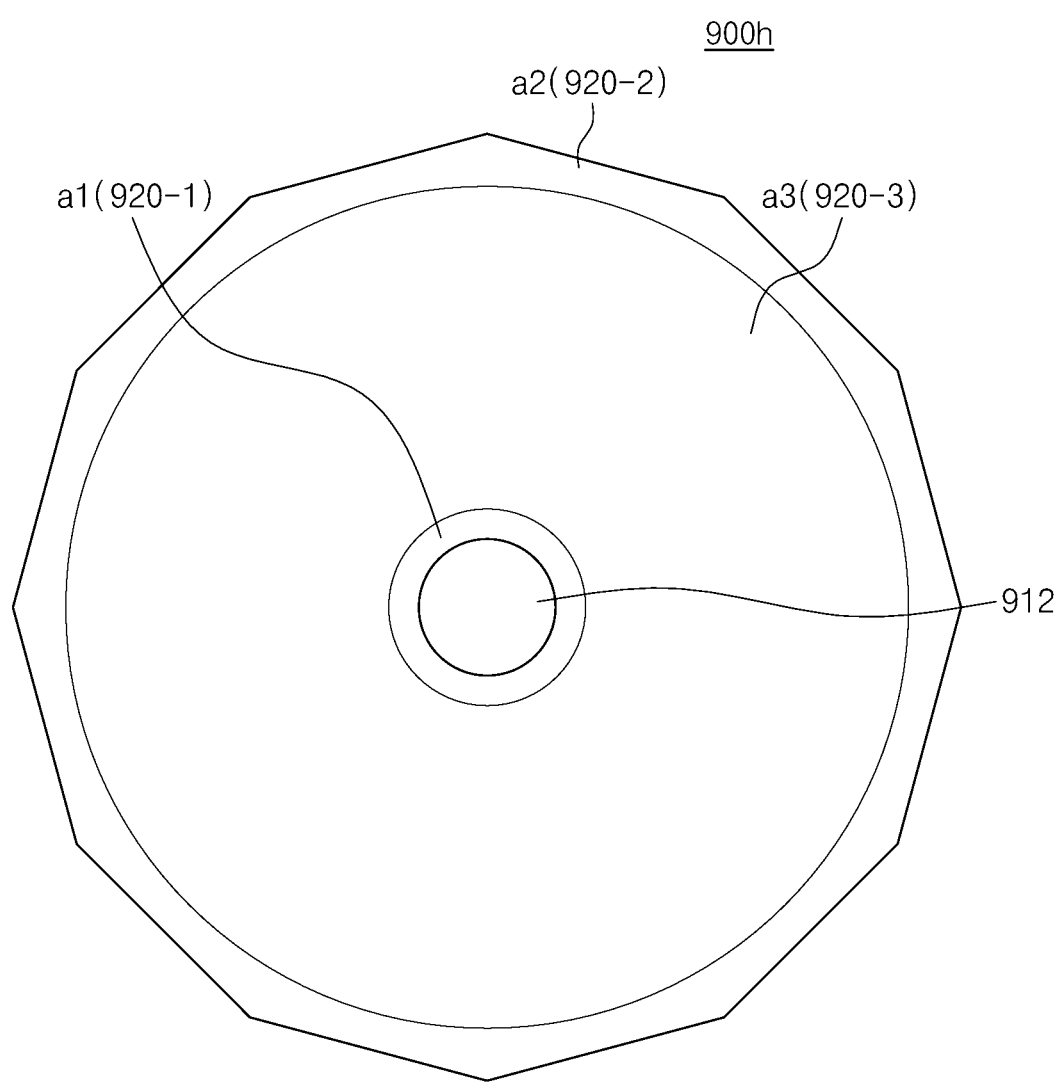
FIG. 19 is a view illustrating a heating unit according to an eighth modified example.

FIG. 19 is a view illustrating a heating unit 900h according to an eighth modified example.

The heating unit 900h according to the eighth modified example is characterized in that the heating unit 900h has a polygonal shape with non-curved edges for convenience in manufacturing heating modules 920-1, 920-2, and 920-3.

Figure 20:
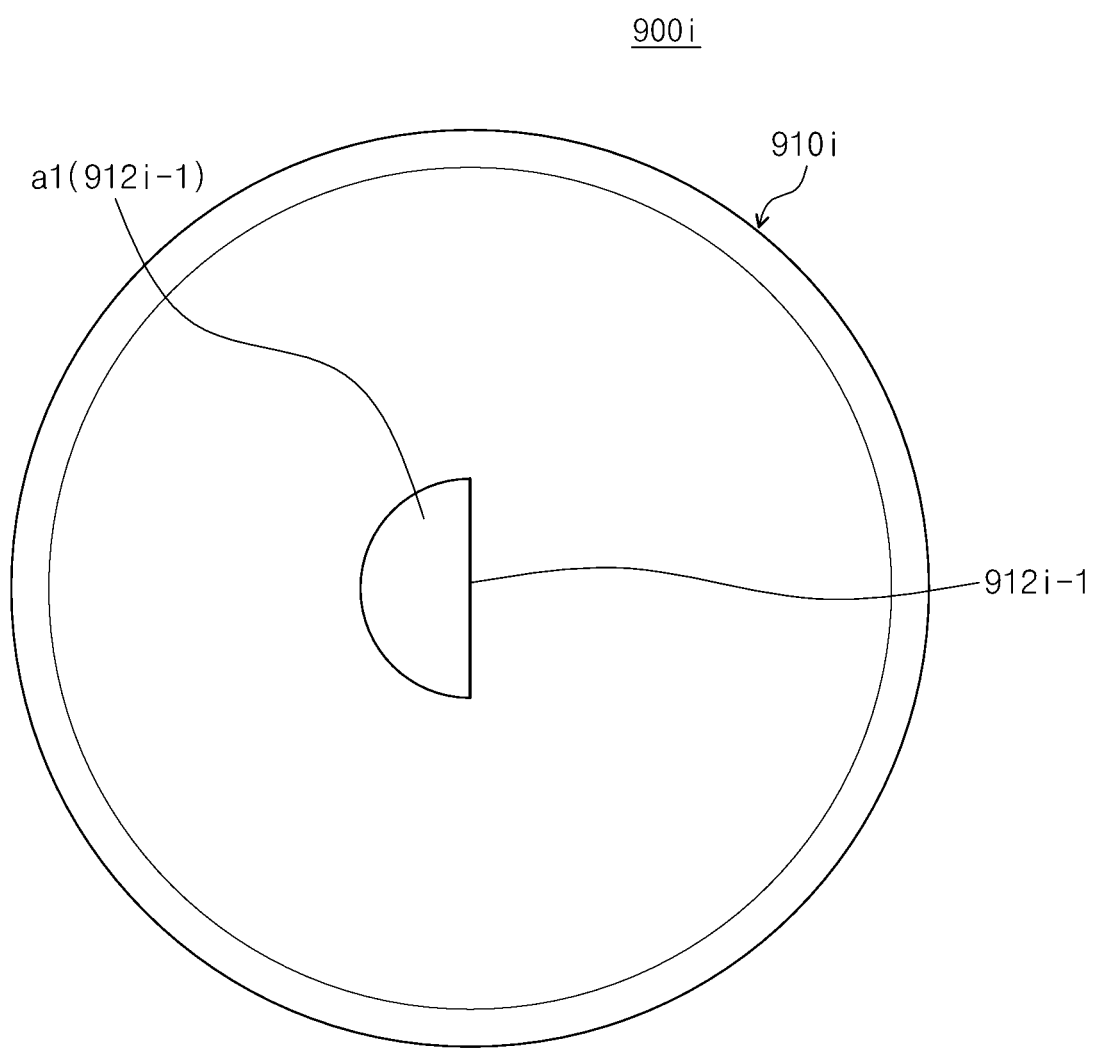
FIGS. 20 and 21 are views illustrating a heating unit according to a ninth modified example.
Figure 21:
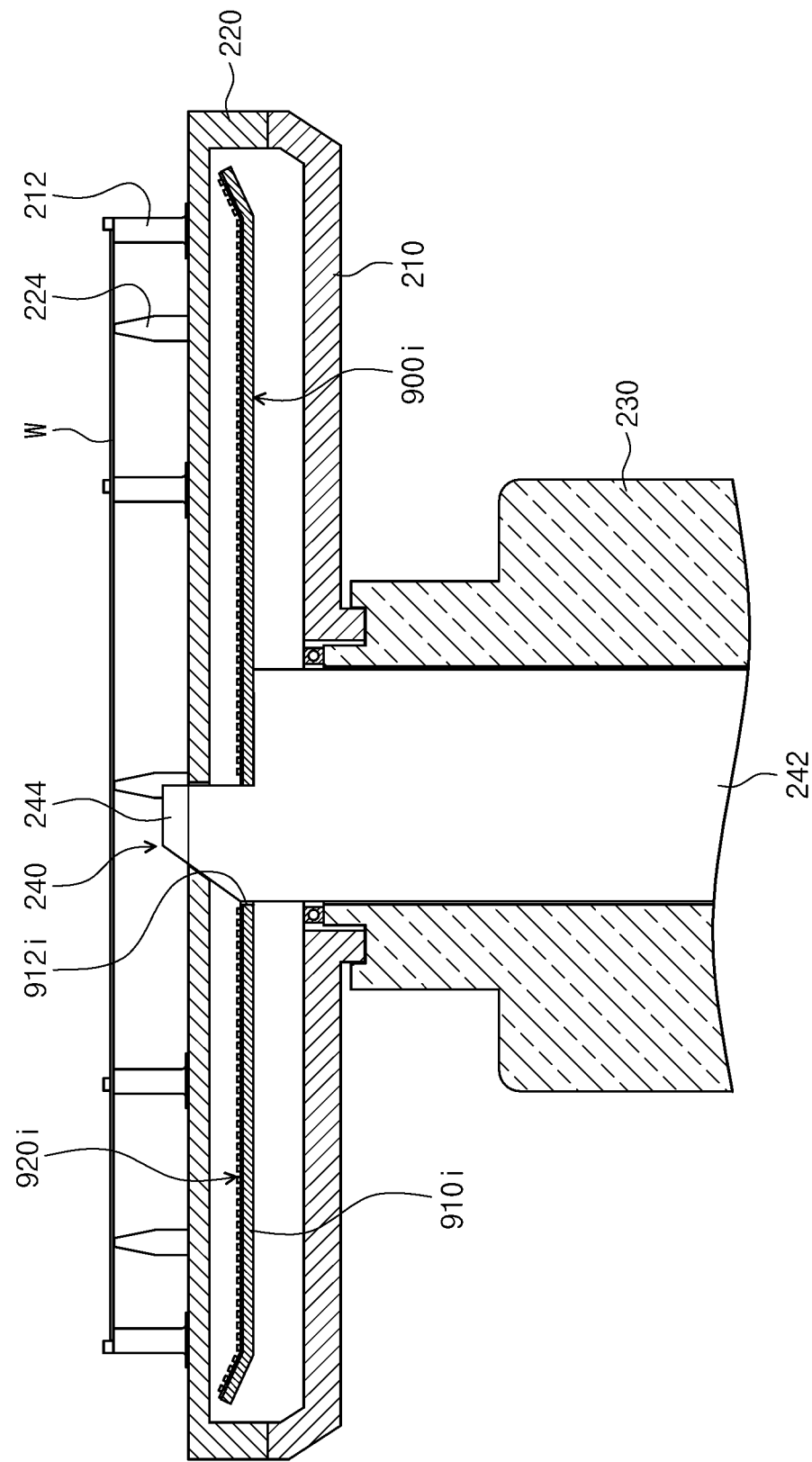

FIGS. 20 and 21 are views illustrating a heating unit 900i according to a ninth modified example.

The heating unit 900i according to the ninth modified example is characterized in that a heating plate 910i of the heating unit 900i has a semicircular opening 912i. The semicircular opening 912i may be disposed such that a diametric side 912i-1 thereof passes through the center of the heating plate 910i. As the number of LED control channels of heating modules 920i of the heating unit 900i increases, the number of cables connected to the heating modules 920i also increases, and therefore the opening 912i in which the cables are located needs to be enlarged. For example, in the case of the heating plate 910 having the opening 912 formed in the center thereof as illustrated in FIG. 8, the thermal uniformity at the center of the substrate W may be relatively degraded with an increase in the size of the opening 912. Hence, the heating plate 910 has a limitation in increasing the size of the opening 912.

However, as in the ninth modified example, the opening 912i in a semicircular shape is eccentrically located on a side of the heating plate 910i, and thus the heating unit 900i has an advantageous effect of maintaining the thermal uniformity of the substrate W even though the size of the opening 912i is increased.

According to the embodiments, the inventive concept has an advantageous effect of reducing a temperature deviation of a substrate.

In addition, the inventive concept has an advantageous effect of actively responding to a change in environments inside the substrate processing apparatus or a change in the temperature outside the substrate processing apparatus.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for supporting a substrate, the apparatus comprising:
    a chuck stage having an inner space defined by a base and sidewalls;
    a heating unit provided in the inner space of the chuck stage; and
    a quartz window configured to cover the inner space of the chuck stage, the quartz window having an upper surface on which the substrate is placed,
    wherein the heating unit includes:
    a heating plate having a disk shape with an opening in the center thereof; and
    heating modules mounted on the heating plate, each having a printed circuit board on which heating light sources emitting light for heating are mounted;
    wherein the heating modules are installed in respective heating zones on the heating plate that are divided from each other, and the heating light sources emit light for heating the substrate, in different directions according to the heating zones for an improvement in heating uniformity of the substrate;

wherein the heating zones include at least a central zone, a peripheral zone, and at least one intermediate zone therebetween with respect to a distance from the center of the heating plate, and the peripheral zone is formed to be inclined so as to cause the light for heating to be concentrated on a specific region of the substrate.

2. The apparatus of claim 1, wherein the heating modules are parallel or oblique to the substrate, or are curved with respect to the substrate.

3. The apparatus of claim 1, wherein at least one of the central zone, the peripheral zone, and the intermediate zone is divided into equiangular zones with a predetermined central angle.

4. The apparatus of claim 1, wherein the heating zones include fan-shaped equiangular zones with a predetermined central angle that are divided from each other with respect to the heating plate.

5. The apparatus of claim 1, wherein at least one of the heating zones other than the peripheral zone is inclined or curved to cause the light for heating to be concentrated on the specific region of the substrate.

6. The apparatus of claim 1, wherein at least one of the heating zones other than the peripheral zone is downwardly inclined or convex toward the outside to cause the light for heating to be diffused.

7. The apparatus of claim 1, wherein each of the heating modules further includes a heat rejection member on a bottom side of the printed circuit board.

8. The apparatus of claim 1, wherein the heating plate has a heat rejection structure with a fluid flow channel through which fluid flows, to reject heat generated by the heating modules.

9. The apparatus of claim 1, wherein the heating light sources include light emitting diodes.

10. The apparatus of claim 1, wherein some of the heating light sources located in the heating zones emit the light for heating in a different direction.

11. The apparatus of claim 1, wherein the opening has a semicircular shape.

12. The apparatus of claim 11, wherein the semicircular opening is disposed such that a diametric side of the semicircular opening passes through the center of the heating plate.

13. The apparatus of claim 1, further comprising:
a rotary part combined with the chuck stage to rotate the chuck stage, the rotary part having a hollow shape,
wherein the heating unit is not rotated in the chuck stage.

14. An apparatus for processing a substrate, the apparatus comprising:
a processing vessel that is open at the top;
a substrate support unit located in the processing vessel and configured to support the substrate;
a processing liquid supply unit configured to supply a processing liquid to the substrate placed on the substrate support unit; and
a heating unit provided in the substrate support unit, the heating unit having a heating plate on which heating modules are mounted, each of which has a printed circuit board on which heating light sources emitting light for heating the substrate are mounted,
wherein the heating unit has a first heating zone in which the heating modules illuminating a specific region of the substrate to compensate for temperature of the specific region are arranged and a second heating zone in which the heating modules illuminating a normal region of the substrate other than the specific region are arranged;
wherein the heating modules arranged in the second heating zone are parallel to the substrate, and the heating modules arranged in the first heating zone are oblique to the substrate or are curved with respect to the substrate.

15. The apparatus of claim 14, wherein a direction of the light for heating that is emitted from the heating modules arranged in the first heating zone is different from a direction of the light for heating that is emitted from the heating modules arranged in the second heating zone.

16. The apparatus of claim 14, wherein the first heating zone is provided on a concentric circle with respect to the center of the heating plate.

17. The apparatus of claim 14, wherein the first heating zone is at least one of fan-shaped equiangular zones with a predetermined central angle that are divided from each other with respect to the center of the heating plate.

18. The apparatus of claim 14, wherein each of the heating modules further includes a heat rejection member on a bottom side of the printed circuit board.

19. The apparatus of claim 14, wherein the heating plate has a heat rejection structure with a fluid flow channel through which fluid flows, to reject heat generated by the heating modules.

20. The apparatus of claim 14, wherein the substrate support unit includes:
a chuck stage having an inner space defined by a base and sidewalls;
a quartz window configured to cover the inner space of the chuck stage, the quartz window having an upper surface on which the substrate is placed; and
a rotary part combined with the chuck stage to rotate the chuck stage, the rotary part having a hollow shape, and
wherein the heating unit is not rotated in the inner space of the chuck stage.

\* \* \* \* \*